United States Patent

Bauer et al.

[11] Patent Number: 5,825,051
[45] Date of Patent: Oct. 20, 1998

[54] OPTOELECTRONIC COMPONENT WITH CENTRAL HOLLOW

[75] Inventors: Karl-Heinz Bauer, Bad Neustadt; Ulrich Brueggemann, Heustreu, both of Germany

[73] Assignee: Preh-Werke GmbH & Co. KG, Bad Neustadt/Saale, Germany

[21] Appl. No.: 928,504

[22] Filed: Sep. 12, 1997

[30] Foreign Application Priority Data

Oct. 12, 1996 [DE] Germany .................. 196 42 168.3

[51] Int. Cl.⁶ ........................................... H01L 33/00
[52] U.S. Cl. .......................... 257/82; 257/95; 257/98; 257/99; 257/100
[58] Field of Search ................. 257/98, 95, 99, 257/100, 82

[56] References Cited

U.S. PATENT DOCUMENTS 4,907,044  3/1990  Schellhorn et al. ............. 313/498 X

FOREIGN PATENT DOCUMENTS

| | | |
|---|---|---|
| 0 580 082 | 1/1994 | European Pat. Off. . |
| 85 00 013.2 | 6/1985 | Germany . |
| 39 31 668 | 4/1991 | Germany . |
| 93 03 327.3 | 6/1993 | Germany . |
| 58-204576 | 11/1983 | Japan ...................... 257/98 |
| 60-213069 | 10/1985 | Japan ...................... 257/98 |
| 61-187384 | 8/1986 | Japan ...................... 257/98 |
| 2051287 | 2/1990 | Japan ...................... 257/100 |
| 5102528 | 4/1993 | Japan ...................... 257/98 |

OTHER PUBLICATIONS

Inverted–Cone Type Light–Emitting Element Lamp; Pub. No. 61–127186 (A); Pub. 14.6.1986 (19) JP Pat.Appln. No. 59–247800; filed 22.11.1984; Sharp Corp (72); Masaaki Kato.

*Primary Examiner*—William Mintel
*Attorney, Agent, or Firm*—Griffin, Butler, Whisenhunt & Szipl, LLP

[57] ABSTRACT

An optoelectronic component for improved distribution of light in a horizontal plane has an elongated body (2) with a central hollow (6) at a top portion (3) thereof, a base (4), and an electrical connection (5). An internally emitted luminescent beam (7) is deflected by the central hollow (6) through transparent portions of the body into the horizontal plane. A height of the component (1) is thereby reduced, and light is fed into light guides more efficiently. Light distribution on all sides is made possible by a conical central hollow. The luminescent beam (7) can be concentrated into four beams by using a pyramidal hollow (6), so that the luminescent beam (7) can be efficiently fed into four light guides that cross at that location.

4 Claims, 1 Drawing Sheet

OPTOELECTRONIC COMPONENT WITH CENTRAL HOLLOW

BACKGROUND OF THE INVENTION

This invention relates generally to an optoelectronic component with luminescent beam-emitting characteristics, including a body having electrical connections that is made to be transparent for radiation of luminescent beams generated within the body.

Optoelectronic components are necessary for illuminating switches and instruments in interiors of motor vehicles for example, specifically on instrument panels. Commercial LEDs (light-emitting diodes) have lenses formed at top portions thereof, as disclosed in European patent document (EP 0 580 082 B1), for example.

A luminescent beam generated in such an LED is utilized, directly or via a light guide, for illuminating switches and instruments. A disadvantage of this design is that a loss of light occurs at an area of the lens, if the luminescent beam (light) is coupled directly into a horizontally arranged light guide.

U.S. patent document (U.S. Pat. No. 4,907,044) discloses an optical transmitter component wherein a proposed LED is lenticular in shape at a top portion. Thus, light exits above the top portion. This is deliberate, since the light beams are to be distributed uniformly across a light exit above the top portion of the LED. A shape of side surfaces of a beam-radiating device causes light deflected onto the lens to be refracted in a direction of a surface to be illuminated.

Uniform light distribution in an illuminated indicator panel is disclosed in German patent document (DE39 31 668 A1), wherein, as before, light exits an illuminating device above a top portion, or head, of an LED. The head of the LED is also lenticular in shape. Uniform illumination of symbols on the indicator panel is achieved by means of laterally positioned reflecting layers within a recess in which the LED is positioned.

Japanese patent document (JP 61-127 186(A)) discloses an illuminating device having an LED inside a housing or recess, wherein, once again, an intended light exit from the illuminating device is located above a top portion of the LED. Light distribution is achieved through lateral reflection to the top portion surface of the illuminating device. A notch is located in the top portion of the LED, the notch being formed by intersecting, straight-sided surfaces. A first deflection of light thus occurs at these two surfaces, and a second via reflections at the sides. Further, the notch is located on a square LED unit, and extends only to two sides of the LED unit at the top portion.

An illuminating device having at least one reflection surface is disclosed in German patent document (DE93 03 327 U1). This reflection surface is located on an outer surface of a housing. A shape of the illuminating device is selected so that a direct application, rather than an application with a fiber-optic cable, is utilized.

An optical component having variable radiating and receiving characteristics is disclosed in German patent document (DE 85 00 013U1) in which, among other things, light exit surfaces have lenticular, preferably reflecting, curvatures. This makes a light exit located below the LED possible, as well. Light is not only deflected in horizontal directions.

It is an object of this invention to provide an optoelectronic component with which it is possible to couple light horizontally into a light guide with as little loss as possible.

SUMMARY

According to the principles of this invention, an optoelectronic component has a central hollow located at a top portion of an elongated body in which a luminescent light beam is produced, along a longitudinal axis of the body at a transparent exit for the luminescent beam, for deflecting the luminescent beam through the transparent exit along a horizontal plane, with the central hollow slopingly extending to all sides of the body at the top portion.

BRIEF DESCRIPTION OF THE DRAWINGS

The invention is described and explained in more detail below using an embodiment shown in the drawings. The described and drawn features, in other embodiments of the invention, can be used individually or in preferred combinations. The foregoing and other objects, features and advantages of the invention will be apparent from the following more particular description of a preferred embodiment of the invention, as illustrated in the accompanying drawings in which reference characters refer to the same parts throughout the different views. The drawings are not necessarily to scale, emphasis instead being placed upon illustrating principles of the invention in a clear manner.

DESCRIPTION OF THE PREFERRED EMBODIMENT

Figure 1:
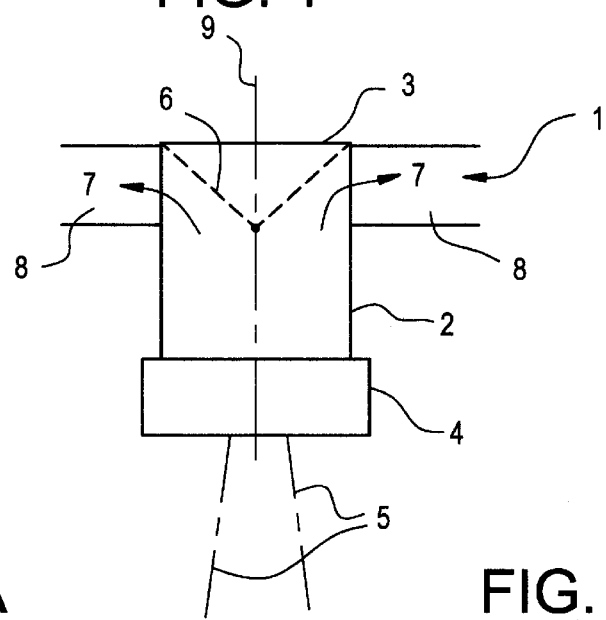
FIG. 1 is an enlarged side view of an LED of this invention.

FIG. 1 shows an optoelectronic component 1 with light-beam-emitting characteristics, including a body 2 divided into a top portion 3 and a base, or socket, 4. Electrical connections 5 are on the base 4. Generally, the body 2, at least the top portion 3 thereof but possibly also in its entirety, is made of transparent resinous plastic. The connections 5 serve in a known manner for supplying voltage to the component 1. In the component 1 of this invention, a central hollow 6 is located in a top of the top portion 3, along a longitudinal axis 9 of the body 2. A transparent exit for a luminescent beam 7 in the top portion 3 is marked 8.

The body 2 and the base 4 can be round, rectangular or polygonal with other numbers of sides. Combinations of these shapes are also possible, so that a rectangular base 4 can be assembled with a round body 2.

Figure 2A:
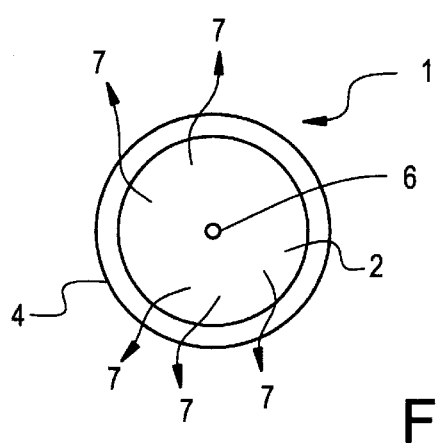
FIG. 2A is a top view of the LED of FIG. 1 with a conical hollow.

As illustrated in FIG. 2A, the component 1 is round. In this design, the hollow 6 is conical.

Figure 2B:
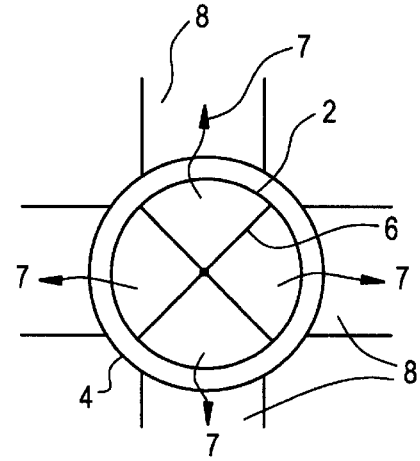
FIG. 2B is a top view of an LED of this invention with a pyramidal hollow.

A further possibility is illustrated in FIG. 2B, wherein the central hollow 6 is pyramidal in shape.

Figure 2C:
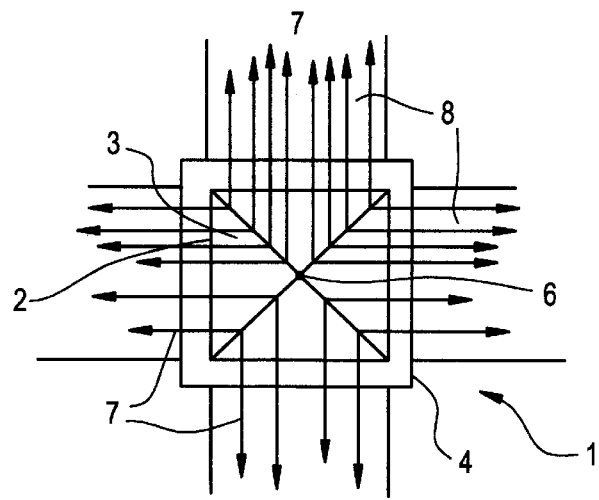
FIG. 2C is a top view of a squared LED of this invention with a pyramidal hollow.

FIG. 2C illustrates a component 1 with a rectangular body 2 and a rectangular base 4. In this design, the central hollow 6 is pyramidal, but may also be conical (not illustrated).

The optoelectronic component 1 is manufactured in a conventional manner. The top portion 3 with its central hollow 6 is shaped when it is injection molded on, about or as part of an LED, by means of a known injection molding process. The geometry or shape of a mold for extrusion coating, which itself has a mirror-like polished finish, also determines an internal shape of the central hollow 6. The central hollow 6 has a very smooth, pore-free surface, owing to the mirror-like polished finish of the mold surface, so that the luminescent beam 7 deflects, i.e. diffracts, on this hollow 6.

By application of operating voltage on the connections 5, a semiconductor diode of which the optoelectronic component 1 is basically comprised, is caused to emit, in a known manner, spontaneous luminescent radiation, or a beam, 7 at its p-n junction. This luminescent beam 7 is deflected by the central hollow 6 horizontally to the exit 8. A degree of horizontal deflection, i.e. an intensity of the deflected luminescent beam 7 at the exit 8, depends on a depth of the central hollow 6 toward the base 4. If the conical/pyramidal sides sloping toward each other are short, the luminescent beam 7 deflected horizontally is concentrated in a part of, or near to, a top of the transparent top portion 3. The exit 8 is small, height-wise. The depth of the central hollow 6 is small. Greater depth of the hollow 6 results in a broad deflection of the luminescent beam 7, and in a large exit 8 along the height of the body 2.

If the top portion 3 of the body 2 is round, and if the central hollow 6 is conical, the luminescent beam 7 is uniform about the top portion 3 in the horizontal plane. If the central hollow 6 is pyramidal (four sides), the luminescent beam 7 is deflected into four sub-beams (directions), with a rounded outer edge of the body 2 at the exit 8 causing an additional diffraction of the exiting luminescent sub-beam 7 at the curve; thus, it is advantageous to mold a pyramidal hollow 6 into a square top portion 3 with a square body 2. In this process, it must be ensured that starts of the sides that run together at the center are positioned at the edges of the hollow 6 in each instance.

By means of a known light guide (not shown) located in the horizontal plane relative to the optoelectronic component 1, the luminescent beam 7 is distributed in a conventional manner to various switches and instruments that are connected to the light guide. If the top portion 3 is round, the light guides are preferably located around the component 1, connected to the exit 8 in the horizontal plane. If the top portion 3 is polygonal, as in a rectangular design, the light guides lie directly adjacent to the deflected beams.

The number of sub-beams from the deflected luminescent radiation or beam 7 depends on the geometrical shape of the hollow 6 in the top portion 3. If the hollow 6 is hexagonal, there are six sub-beams. The luminescent beam 7 is then deflected into six sub-beams. Other geometrical shapes of the hollow 6 are possible, as needed, whereby the exterior shape of the top portion 3 should be adapted to the interior hollow 6. For example, if the hollow 6 is octagonal, eight exits 8 must be allocated to that shape by means of an octagonal top portion 3, whereby the hollow 6 begins at the respective upper edge points of the exits 8.

By means of the hollow extending toward the center, at the top of the LED, emitted light is deflected in the horizontal plane. The light concentrated in this manner is radiated horizontally and is received to a maximum extent by the light guides surrounding the LED.

The light can be deflected horizontally into four, for example, beams by means of a pyramidal recess or hollow. A polygonal hollow with even more sides increases the breadth of a spectrum of use for the proposed LED arrangement.

While the invention has been particularly shown and described with reference to a preferred embodiment, it will be understood by those skilled in the art that various changes in form and detail may be made therein without departing from the spirit and scope of the invention.

The invention claimed is:

1. An optoelectronic component having luminescent beam-emitting characteristics comprising:

an elongated body having electrical connections, said body being transparent at a body exit thereof;

a luminescent beam generating means in the body for generating light for exiting from said body at said body exit;

wherein the component defines a central hollow at a top of the body, located at the transparent body exit along a longitudinal axis of the body for deflecting the light into a horizontal plane, whereby the central hollow slopingly extends toward all sides of the body.

2. An optoelectronic component as in claim 1, wherein the shape of the central hollow is conical.

3. An optoelectronic component as in claim 1, wherein the shape of the central hollow is pyramidal.

4. An optoelectronic component as in claim 1, wherein the shape of the central hollow is polygonal.

* * * * *

REEXAMINATION CERTIFICATE (4115th)

United States Patent [19]
Bauer et al.

[11] B1 5,825,051
[45] Certificate Issued: Jul. 11, 2000

[54] OPTOELECTRONIC COMPONENT WITH CENTRAL HOLLOW

[75] Inventors: Karl-Helnz Bauer, Bad Neustadt; Ulrich Brueggemann, Heustreu, both of Germany

[73] Assignee: Preh-Werke GmbH & Co. KG, Bad Neustadt/Saale, Germany

Reexamination Request:
No. 90/005,301, Apr. 12, 1999

Reexamination Certificate for:
Patent No.: 5,825,051
Issued: Oct. 20, 1998
Appl. No.: 08/928,504
Filed: Sep. 12, 1997

[30] Foreign Application Priority Data

Oct. 12, 1996 [DE] Germany .......................... 196 42 168

[51] Int. Cl.⁷ .................................................. H01L 33/00
[52] U.S. Cl. .................. 257/82; 257/95; 257/98; 257/99; 257/100
[58] Field of Search ................... 257/82, 95, 98, 257/99, 100

[56] References Cited

U.S. PATENT DOCUMENTS 4,907,044 3/1990 Schellhorn et al. ................. 313/498 X

FOREIGN PATENT DOCUMENTS

| 891.622 | 4/1982 | Belgium . |
| 85 00 013 | 6/1985 | Germany . |
| 39 31 668 A1 | 4/1991 | Germany . |

OTHER PUBLICATIONS

Patent Abstract of Japan, vol. 010, No. 317 (E–449), Oct. 28, 1986 & JP 61127186 A (Sharp Corp.) Jun. 14, 1986.
Patent Abstract of Japan, vol. 097, No. 002, Feb. 28, 1997 & JP 08255934A, (Hayashi Telempu Co. Ltd; Koike Yasuhiro), Oct. 1, 1996.
Patent Abstract of Japan, vol. 095, No. 011, Dec. 26, 1995 & JP 07199829 A (Harrison Denki KK), Aug. 4, 1995.
American Heritage Dictionary, Second College Edition, (Houghton Mifflin Co., Boston 1982); p. 1008.

*Primary Examiner*—William Mintel

[57] ABSTRACT

An optoelectronic component for improved distribution of light in a horizontal plane has an elongated body (2) with a central hollow (6) at a top portion (3) thereof, a base (4), and an electrical connection (5). An internally emitted luminescent beam (7) is deflected by the central hollow (6) through transparent portions of the body into the horizontal plane. A height of the component (1) is thereby reduced, and light is fed into light guides more efficiently. Light distribution on all sides is made possible by a conical central hollow. The luminescent beam (7) can be concentrated into four beams by using a pyramidal hollow (6), so that the luminescent beam (7) can be efficiently fed into four light guides that cross at that location.

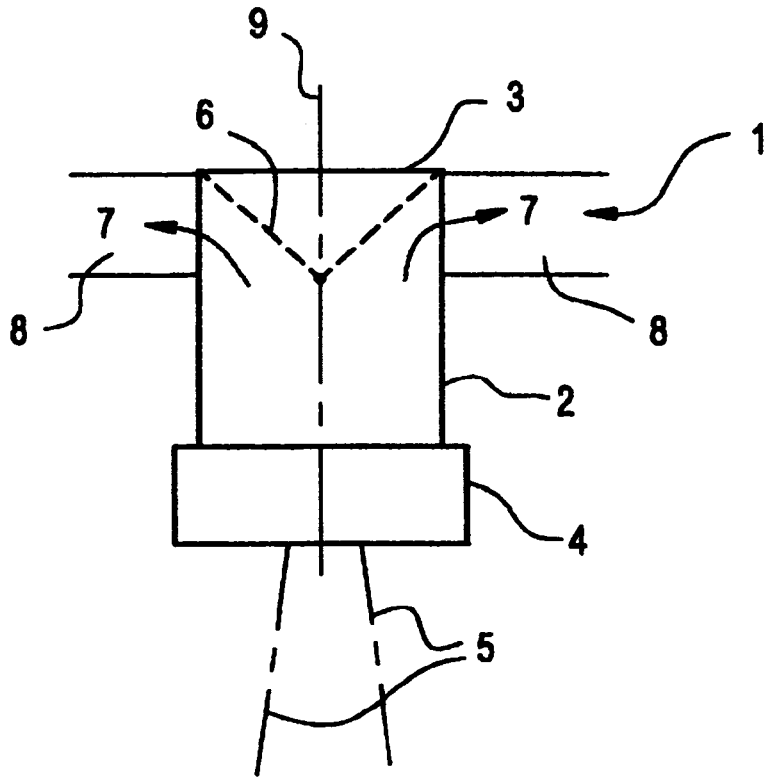

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–4 are cancelled.

* * * * *